US011400560B2

(12) United States Patent
Oh et al.

(10) Patent No.: US 11,400,560 B2
(45) Date of Patent: Aug. 2, 2022

(54) RETAINING RING DESIGN

(71) Applicant: Applied Materials, Inc., Santa Clara, CA (US)

(72) Inventors: Jeonghoon Oh, Saratoga, CA (US);
Charles C. Garretson, Sunnyvale, CA (US); Eric Lau, Santa Clara, CA (US); Andrew Nagengast, Sunnyvale, CA (US); Steven M. Zuniga, Soquel, CA (US); Edwin C. Suarez, Fremont, CA (US); Huanbo Zhang, San Jose, CA (US); Brian J. Brown, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 975 days.

(21) Appl. No.: 16/149,939

(22) Filed: Oct. 2, 2018

(65) Prior Publication Data
US 2019/0099857 A1 Apr. 4, 2019

Related U.S. Application Data

(60) Provisional application No. 62/567,971, filed on Oct. 4, 2017.

(51) Int. Cl.
*B24B 47/02* (2006.01)
*B24B 37/32* (2012.01)
*H01L 21/687* (2006.01)

(52) U.S. Cl.
CPC ............ *B24B 37/32* (2013.01); *H01L 21/687* (2013.01)

(58) Field of Classification Search
CPC ............................. B24B 37/32; H01L 21/687
USPC ................................. 451/398, 288, 285, 442
See application file for complete search history.

(56) References Cited

U.S. PATENT DOCUMENTS

| | | | |
|---|---|---|---|
| 6,143,127 A * | 11/2000 | Perlov | B24B 37/32 156/345.14 |
| 6,186,880 B1 | 2/2001 | Gonzalez et al. | |
| 6,224,472 B1 | 5/2001 | Lai et al. | |
| 6,251,215 B1 | 6/2001 | Zuniga et al. | |
| 7,029,381 B2 | 4/2006 | Melvin et al. | |
| 7,608,173 B2 | 10/2009 | Manens et al. | |
| 7,867,060 B2 | 1/2011 | Aritomo et al. | |

(Continued)

FOREIGN PATENT DOCUMENTS

KR 100764040 B1 10/2007

OTHER PUBLICATIONS

International Search Report and Written Opinion for Application No. PCT/US2018/054022 dated Jan. 25, 2019.

*Primary Examiner* — Joseph J Hail
*Assistant Examiner* — Shantese L McDonald
(74) *Attorney, Agent, or Firm* — Patterson + Sheridan LLP

(57) ABSTRACT

Embodiments herein relate to a retaining ring for use in a polishing process. The retaining ring includes an annular body having an upper surface and a lower surface. An inner surface is connected to the upper surface and the lower surface. The inner surface includes one or more surfaces that are used to retain a substrate during processing. The one or more surfaces have an angle relative to a central axis of the retaining ring. The inner surface also includes a plurality of facets. Channels are disposed within the retaining ring to allow passage of a polishing fluid from an inner surface to an outer surface of the retaining ring disposed opposite of the inner surface.

20 Claims, 6 Drawing Sheets

(56) References Cited

U.S. PATENT DOCUMENTS

| | | |
|---|---|---|
| 9,368,371 B2 | 6/2016 | Oh et al. |
| 2004/0152403 A1* | 8/2004 | Marohl .................. B24B 37/32 451/442 |
| 2005/0191947 A1* | 9/2005 | Chen ....................... B24B 37/32 451/41 |
| 2009/0021024 A1* | 1/2009 | Prabhu .................. B24B 37/32 292/256.6 |
| 2010/0112914 A1 | 5/2010 | Marohl et al. |
| 2015/0021498 A1 | 1/2015 | Hsu et al. |
| 2015/0303070 A1* | 10/2015 | Oh ......................... B24B 41/06 216/53 |
| 2016/0346897 A1 | 12/2016 | Reedy et al. |

\* cited by examiner

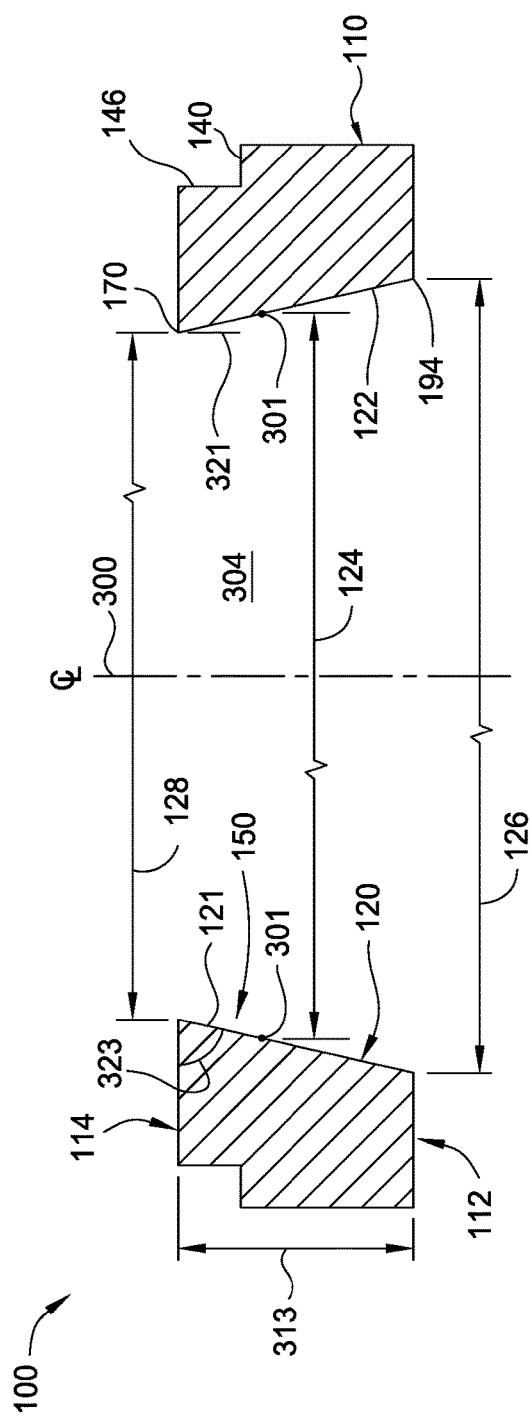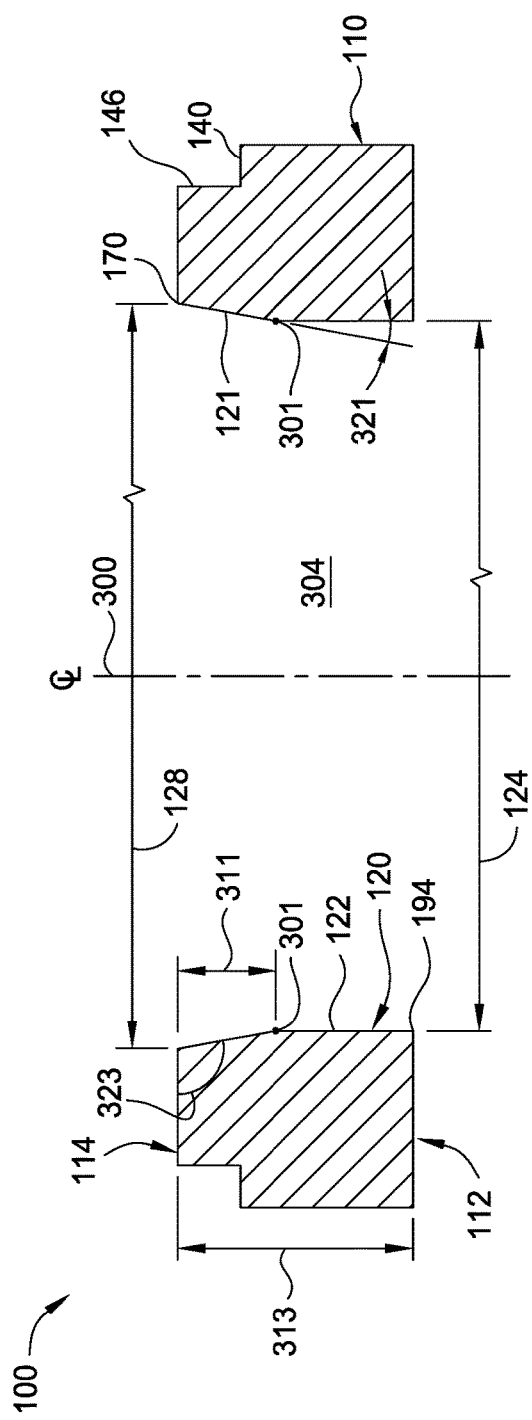

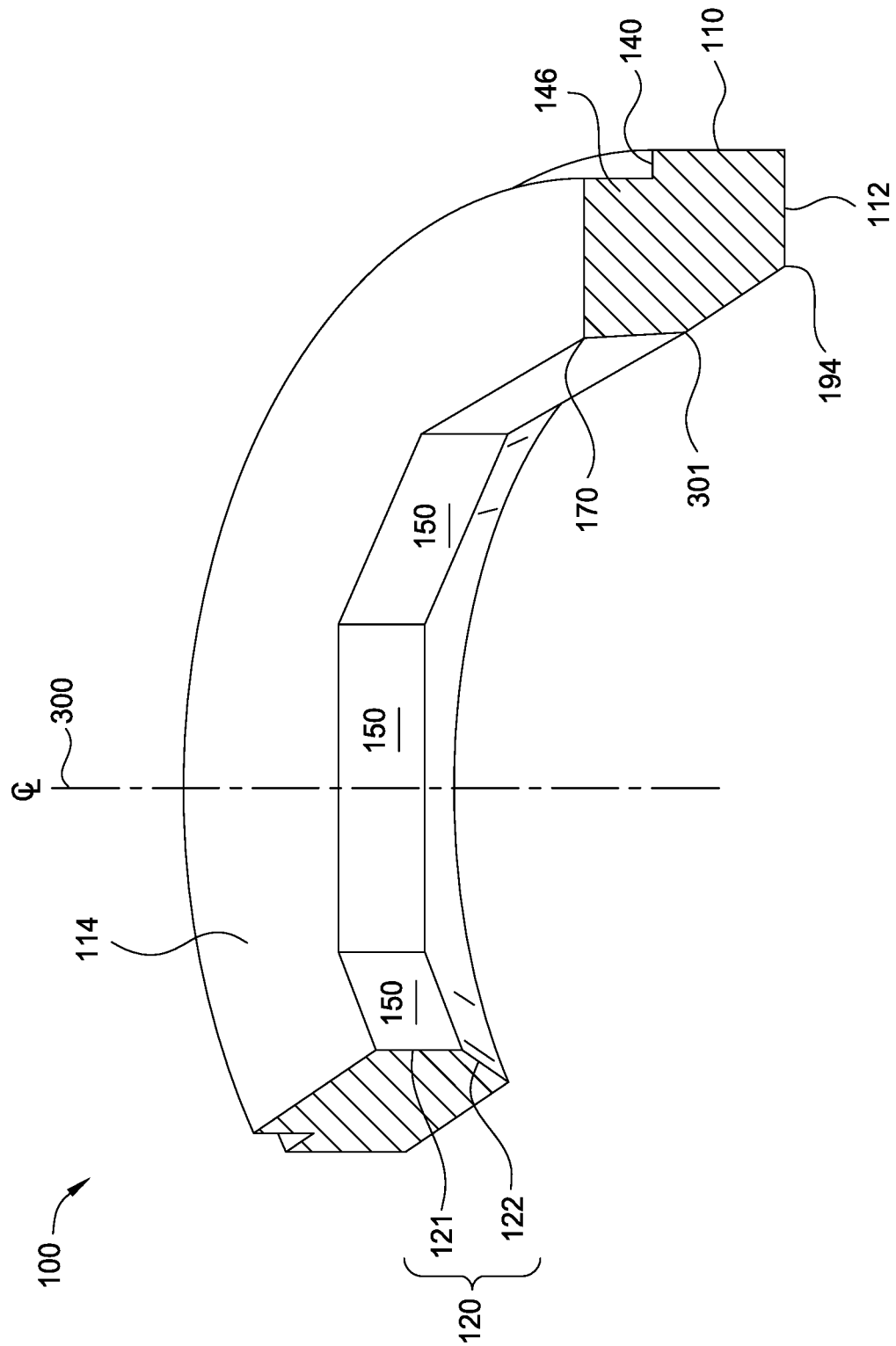

RETAINING RING DESIGN

CROSS-REFERENCE TO RELATED APPLICATIONS

This application claims benefit of U.S. provisional patent application Ser. No. 62/567,971, filed Oct. 4, 2017, which is herein incorporated by reference.

BACKGROUND

Field

Embodiments of the present disclosure generally relate to a retaining ring for use with polishing devices.

Description of the Related Art

Chemical mechanical polishing (CMP) is one process commonly used in the manufacture of high-density integrated circuits to planarize or polish a layer of material deposited on a substrate. A carrier head provides the substrate retained therein to a polishing station of a polishing system and controllably urges the substrate against a moving polishing pad. CMP is effectively employed by providing contact between a feature side of the substrate and moving the substrate relative to the polishing pad while in the presence of a polishing fluid.

The polishing pad may be either a standard pad or a fixed-abrasive pad. A standard pad may have a durable roughened surface, whereas a fixed-abrasive pad may have abrasive particles held in a containment media. The carrier head provides a controllable load on the substrate to push the substrate against the polishing pad. A retaining ring is commonly utilized in the carrier head to retain the substrate during polishing.

Maintaining a uniform material removal profile of the substrate is a desirable when performing a CMP process. Maintaining the uniform profile across the surface of the substrate in both the polar and radial directions is desirable. Accordingly, it is desirable to minimize local non-uniformities in the planarization profile. However, with current CMP apparatus, the substrate may be biased unpredictably in an upward or downward direction at contact points within the carrier head.

Accordingly, what is needed in the art are improved apparatus for CMP processing.

SUMMARY

In one embodiment, a retaining ring is provided. The retaining ring includes an annular body. The annular body includes an upper surface, a lower surface, an outer surface extending between the upper surface and the lower surface, and an inner surface extending between the upper surface and the lower surface. The inner surface includes a first tapered portion disposed at a first angle relative to a central axis, and a second tapered portion disposed at a second angle relative to the central axis. The second tapered portion is coincident with the lower surface at an adjoining edge and an angle formed between the second tapered portion and the lower surface is either less than or greater than 90 degrees.

In another embodiment, a retaining ring is provided. The retaining ring includes an annular body. The annular body includes an upper surface, a lower surface, an outer surface connected to the upper surface and the lower surface, and an inner surface connected to the upper surface and the lower surface. The inner surface includes a first planar surface having a first angle relative to a central axis, a second planar surface having a second angle relative to a central axis, and a third planar surface disposed between the first planar surface and the second planar surface.

In another embodiment, a retaining ring is provided. The retaining ring includes an annular body having an upper surface, a lower surface, an outer surface extending between the upper surface and the lower surface, and an inner surface extending between the upper surface and the lower surface. The inner surface includes a first tapered portion disposed at a first angle relative to a central axis and a second surface tapered portion disposed at a second angle relative to the central axis. The second tapered portion is coincident with the lower surface at an adjoining edge and an angle formed between the second tapered portion and the lower surface is either less than or greater than 90 degrees. The second tapered portion includes an array of planar facets positioned about the central axis. A plurality of channels is disposed within the annual body and have a first opening at the inner surface and a second opening at the outer surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 3C illustrates a cross-sectional view of a retaining ring according to one embodiment of the disclosure.

FIG. 3D illustrates a cross-sectional view of a retaining ring according to one embodiment of the disclosure.

FIG. 3E illustrates a bottom side perspective view in partial cross-section of a retaining ring according to one embodiment of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein relate to a retaining ring for use in a polishing process. The retaining ring includes an annular body having an upper surface and a lower surface. An inner surface is connected to the upper surface and the lower surface. The inner surface includes one or more surfaces that are used to retain a substrate during processing. The one or more surfaces have an angle relative to a central axis of the retaining ring. The inner surface also includes a plurality of facets. Channels are disposed within the retaining ring to allow passage of a polishing fluid from an inner surface to an outer surface of the retaining ring disposed opposite of the inner surface.

Figure 1:
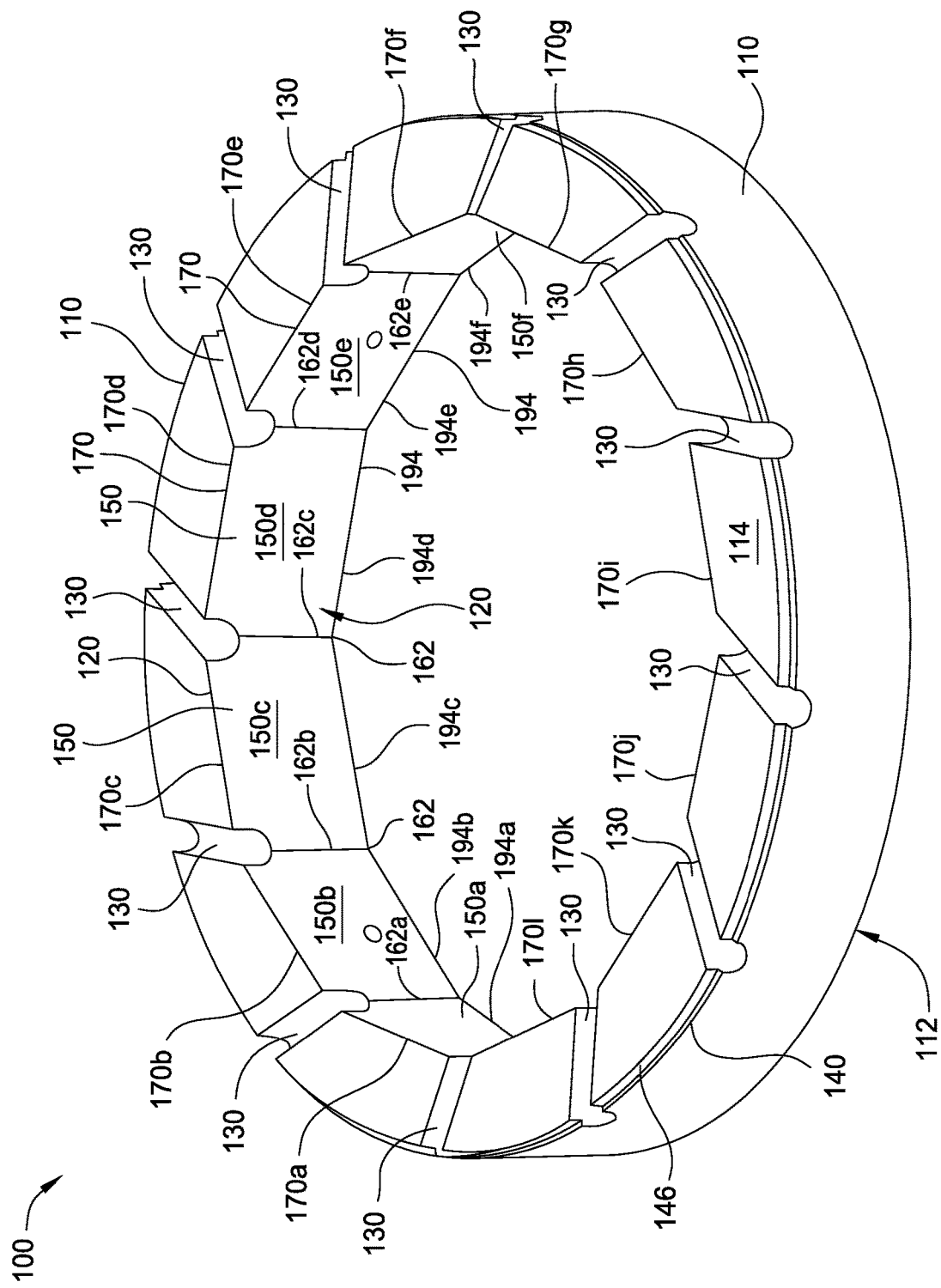
FIG. 1 illustrates a bottom side perspective view of a retaining ring according to one embodiment of the disclosure.

FIG. 1 is a bottom side perspective view of a retaining ring 100. The retaining ring 100 of FIG. 1 is shown with the polishing pad facing side oriented upward for ease of description. In operation, the polishing pad facing side is typically oriented downward during polishing of a substrate. The retaining ring 100 is a generally annular ring having a lower surface 114 which faces a polishing pad (not shown) and an opposing upper surface 112 which faces a carrier head (not shown) to which the retaining ring is typically attached. The retaining ring 100 has an outer surface 110 opposite of an inner surface 120. The outer surface 110 has a circular shape when viewed in a top or bottom planar view, such as FIG. 2. The outer surface 110 and inner surface 120 are disposed opposite one another and adjacent to the upper surface 112 and the lower surface 114. In one embodiment, the outer surface 110 includes a step 140. The step 140 has an adjacent surface 146 which extends from the step 140 to the lower surface 114. The adjacent surface 146 has an outer diameter that is smaller than an outer diameter of the outer surface 110.

In one embodiment, the lower surface 114 is a flat surface containing channels 130. The channels 130 are recesses, gaps, or troughs extending from the inner surface 120 to the outer surface 110 and are formed in to the lower surface 114. The channels 130 have a first opening at the inner surface 120 and a second opening at the outer surface 110. The channels 130 enable a polishing fluid to flow between an area contained within the inner surface 120, underneath the retaining ring 100, and the outer surface 110. The polishing fluid may be a slurry containing a chemical agent or particles removed from the substrate by the polishing pad. Here, the channels 130 have a semicircular cross-section but any cross-section or shape capable of transferring a polishing fluid may be utilized. Further, twelve channels 130 are shown in FIG. 1 but more or less may be utilized.

The inner surface 120 is formed from multiple facets 150 including individual facets 150a, 150b, 150c, 150d, 150e, 150f (not all shown). Each facet 150 is a flat, planar surface which joins abutting facets at corners 162 including 162a, 162b, 162c, 162d, 162e (not all shown or labeled). The facets 150 abut the lower surface 114 at edges 170, including edges 170a-l. In one configuration, as shown, opposite of edges 170, the facets 150 abut the upper surface 112 at edges 194, including edges 194a-f (not all shown). Here, the inner surface 120 has twelve facets as seen in FIG. 2, which is a top down view of the retaining ring 100 of FIG. 1.

Figure 2:
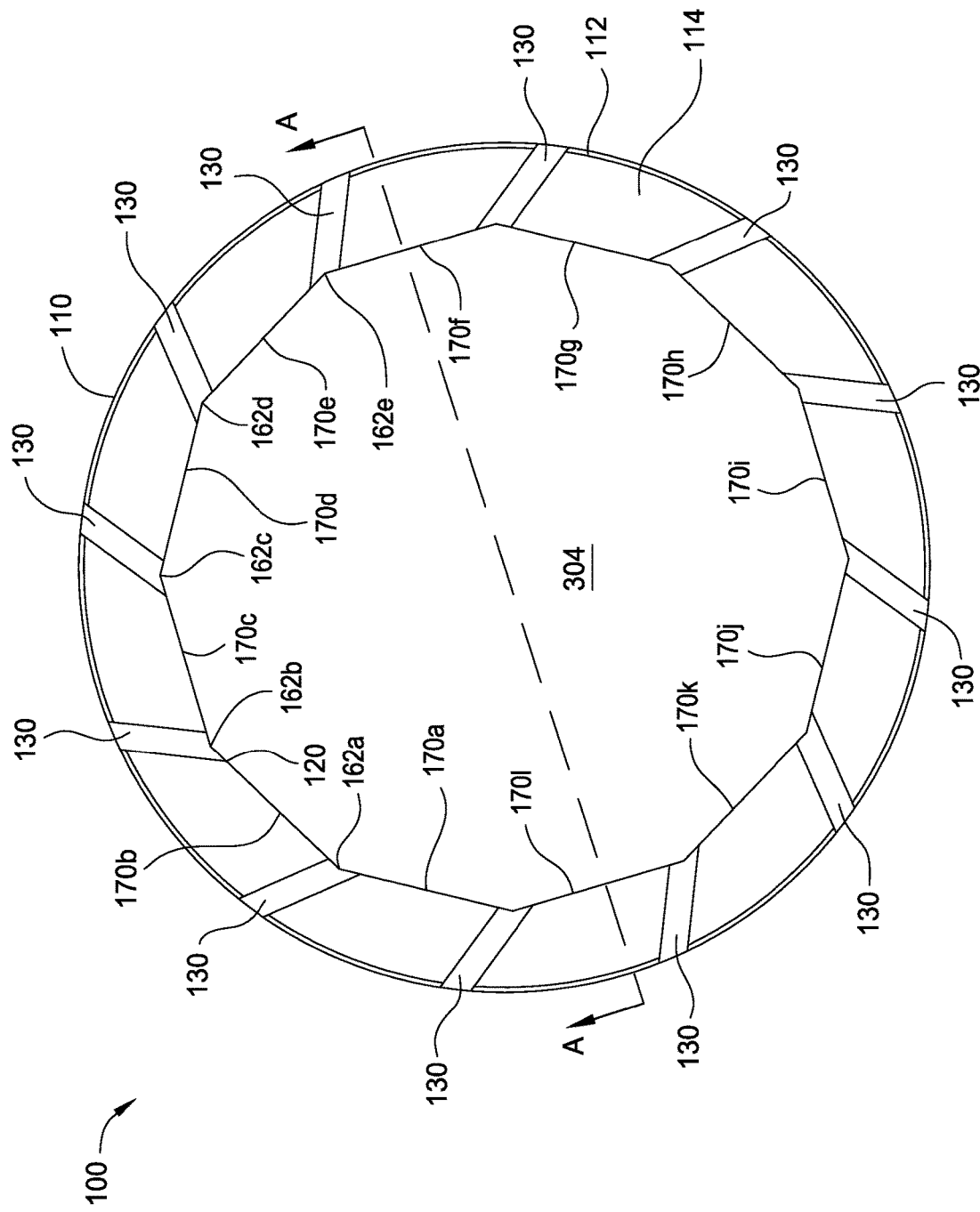
FIG. 2 illustrates a plan view of a retaining ring according to one embodiment of the disclosure.

The inner surface 120 in FIG. 2 defines a dodecagonal cross-section. However, more or less facets may be added in order to improve the radial uniformity profile of the polished substrate. In one embodiment, the inner surface 120 has a circular cross-section to define a vertical cylindrical surface. In one example, the inner surface 120 includes 12 to 100 facets as seen in FIG. 2, which is a top down view of the retaining ring 100 of FIG. 1. In another example, the inner surface 120 includes about 50-80 facets.

FIG. 1 and FIG. 2 show the channels 130 extending from the inner surface 120 at corners 162. It is to be understood that the channels 130 are not limited to this configuration. The channels 130 may be located at any location capable of transferring a polishing fluid from the inner surface 120 to the outer surface 110. In some embodiments, the number of facets 150 formed in the retaining ring 100 is a multiple of the number of channels 130. For example, in a retaining ring 100 that has 12 channels the number of facets 150 formed in the retaining ring may include 24, 36, 48, 60, 72, 84, or even 96 facets.

FIGS. 3A-3D illustrate cross-sectional views of the retaining ring 100 as viewed along the A-A plane of FIG. 2. In FIGS. 3A-3D, the retaining ring 100 is shown with the upper surface 112, the lower surface 114, the outer surface 110, and the inner surface 120 defining a cross section of the retaining ring 100. For ease of description, and as shown in FIGS. 3A-3D, the illustrated retaining ring cross-sections are formed in a radial direction that is perpendicular to the surface of opposing facets 150 that are formed on opposing sides of the retaining ring 100. However, the symmetric configuration of facets 150 shown in FIGS. 3A-3D are not intended to be limiting as to the scope of the disclosure provided herein since other non-radially symmetric facet 150 configurations can be used.

The retaining ring 100 has a thickness 313 between the upper surface 112 and the lower surface 114. The thickness 313 may be in a range, for example, from 12 mm to 36 mm. A central axis 300 passes through a center of the retaining ring 100 to define a center line. In one embodiment, the retaining ring 100 is symmetric about the central axis 300. The retaining ring 100 has a first opening diameter 128 at the lower surface 114 measured at the edge 170 and a second opening diameter 126 at the upper surface 112 measured at the edge 194. A nominal diameter 124 is shown at a nominal inner dimension point 301 that is positioned on the inner surface 120. The nominal diameter 124 is sized to allow the largest diameter substrate to be safely positioned within the interior region 304 of the retaining ring 100 during polishing. The nominal diameter enables some lateral movement (e.g., radial direction of the retaining ring) of the substrate as the substrate and retaining ring are pressed in the central axis 300 direction against a polishing pad (not shown) that is moving relative to the lower surface 114 in a direction that is perpendicular to the central axis 300. The nominal diameter 124 is generally larger than the diameter of the substrate, which is to be disposed within the interior region 304 of the retaining ring 100 during processing. In one example, the nominal diameter 124 is at least 1 millimeter (mm) larger than the largest possible substrate, such as at least 5 mm larger or even 10 mm larger than the largest substrate diameter.

Figure 3A:
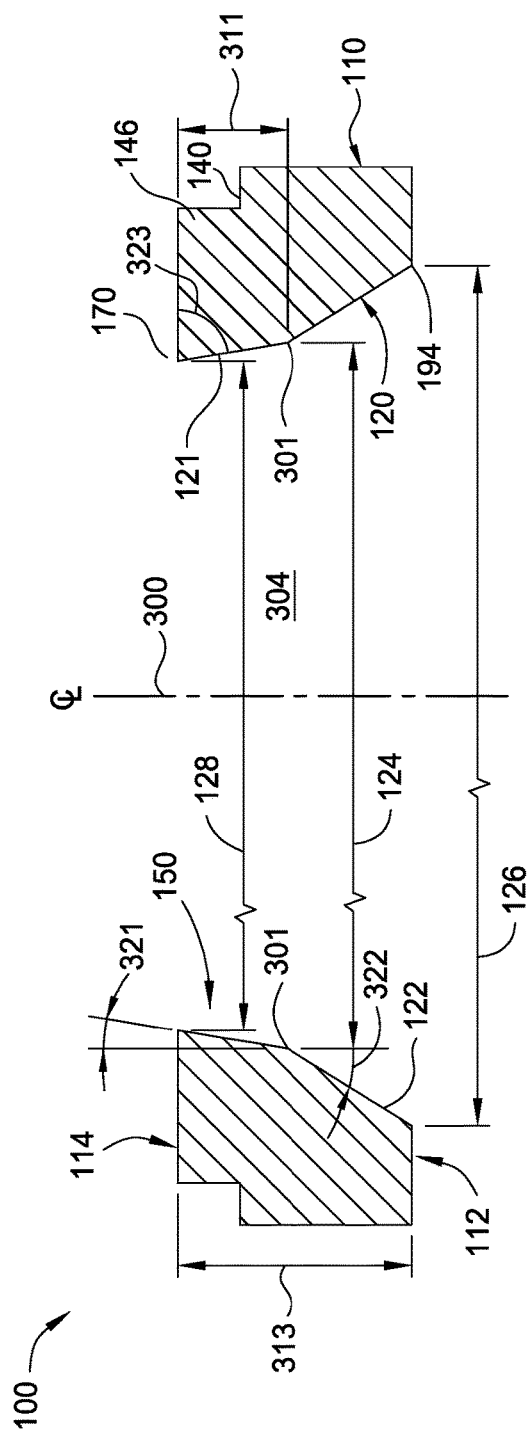
FIG. 3A illustrates a cross-sectional view of a retaining ring according to one embodiment of the disclosure.

In the embodiment of FIG. 3A, the cross-section of the inner surface 120 of the retaining ring 100 includes two sloped planar surfaces. A first surface 122 has an inward projecting taper having a first end at the upper surface 112 and a second end at an edge at the nominal inner dimension point 301. The first surface 122 tapers inwardly from the first end at edge 194 towards the lower surface 114. The surface 122 has a cross-sectional diameter 126 at the first end at edge 194 and a cross-sectional diameter at the second end (i.e., nominal diameter 124). The nominal diameter 124 is less than the cross-sectional diameter 126 where the surface 122 tapers inwardly from the first end towards the second end defined by a slope angle 322. The slope angle 322 is an angle measured along the surface 122 relative to a vertical plane which is parallel to the central axis 300. The slope angle 322 may have a range, for example, from about 5 degrees to about 85 degrees, such as about 10 degrees. In one embodiment, the surface 122 contacts a flexible membrane (not shown) disposed within the carrier head (not shown) during a polishing process. The flexible membrane applies a pressure onto a surface of the substrate disposed within the retaining ring 100 to create a force towards a polishing pad (not shown) in the direction of the central axis. Additionally, the contact between the flexible membrane and the inner surface 120 creates a seal which prevents passage of a polishing fluid therethrough, thus isolating the carrier head from the polishing fluid.

A second surface 121 is a planar tapered surface having a first end at nominal inner dimension point 301 and a second end at lower surface 114 at edge 170. Here, the surface 121 tapers inwardly from the first end towards the lower surface 114. At the edge 194, the surface 121 has a cross-sectional diameter 128. The surface 121 adjoins the surface 122 at the nominal inner dimension point 301 having a common diameter which is diameter 124. In FIG. 3A, the diameter 128 is less than the diameter 124. A thickness 311 of the surface 121 is measured from the edge at the nominal inner dimension point 301 to the lower surface 114. The thickness 311 of the second surface 121 is generally greater than the thickness of the substrate, but may be equal to or less than a thickness of the substrate. The taper of the second surface 121 defines a slope angle 321. The slope angle 321 is measured between the surface 121 relative to a vertical plane parallel to the central axis 300.

In FIG. 3A, the second surface 121 tapers inwardly towards the central axis 300 from the first end to the second end where the diameter 124 is greater than the diameter 128 and slope angle 321 has a positive measure or slope towards the central axis 300. In some alternate configurations, the second surface 121 tapers away from the central axis 300 from the first end to the second end where the diameter 124 is less than the diameter 128 and slope angle 321 has a negative measure or slope away the central axis 300. The slope angle 321 has a range, for example, from about 1 degree to about 30 degrees and may be in a positive value (towards the central axis 300) or a negative value (away from the central axis 300). In one example, the slope angle 321 is in a range from about 2 degrees to about 10 degrees in a positive direction, as shown in FIG. 3A. In such configurations, an angle 323 measured between the lower surface 114 and the surface 121 at the edge 170 is either acute or obtuse. That is, the angle 323 measured between the lower surface 114 and the surface 121 at the edge 170 does not define a right angle. For example, the angle 323 measured between the lower surface 114 and the second surface 121 at the edge 170 is between about 0.5 degrees and about 89.5 degrees or between about 90.5 degrees and about 179.5 degrees.

Figure 4:
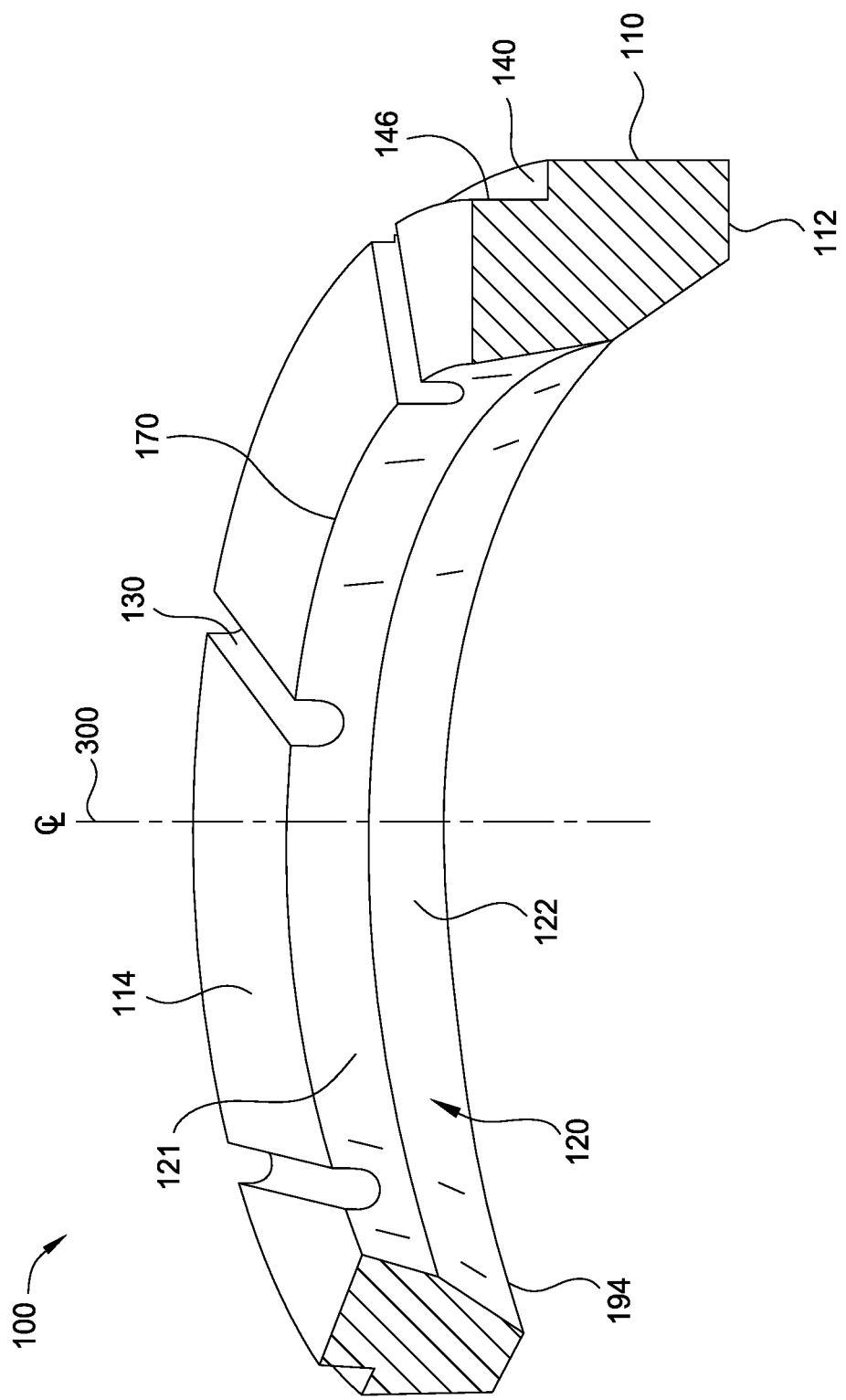
FIG. 4 illustrates a bottom side perspective view in partial cross-section of a retaining ring according to one embodiment of the disclosure.

In some configurations, such as the configuration illustrated in FIG. 3E which is a partial perspective view of the retaining ring 100, the thickness 311 measurement coincides with the magnitude of the vertical dimension (e.g., central axis 300 direction) of each of the facets 150. In this case, the lower extent of the facets 150 will coincide with the edge 170 and the upper extent of the facets 150 will coincide with the nominal inner dimension point 301. The facets 150 are an array of facets centered about the central axis 300 to form the inner surface 121. The array of facets may have a number of facets, for example, from 12 to 100 facets, such as 20 to 80 facets. The surface 122 is formed by a non-faceted frustoconical shape which is symmetric about the central axis 300. In an alternate configuration, the surface 122 and surface 121 are each formed in non-faceted frustoconical shapes that are each symmetric about the central axis 300 as shown in FIG. 4.

Figure 3B:
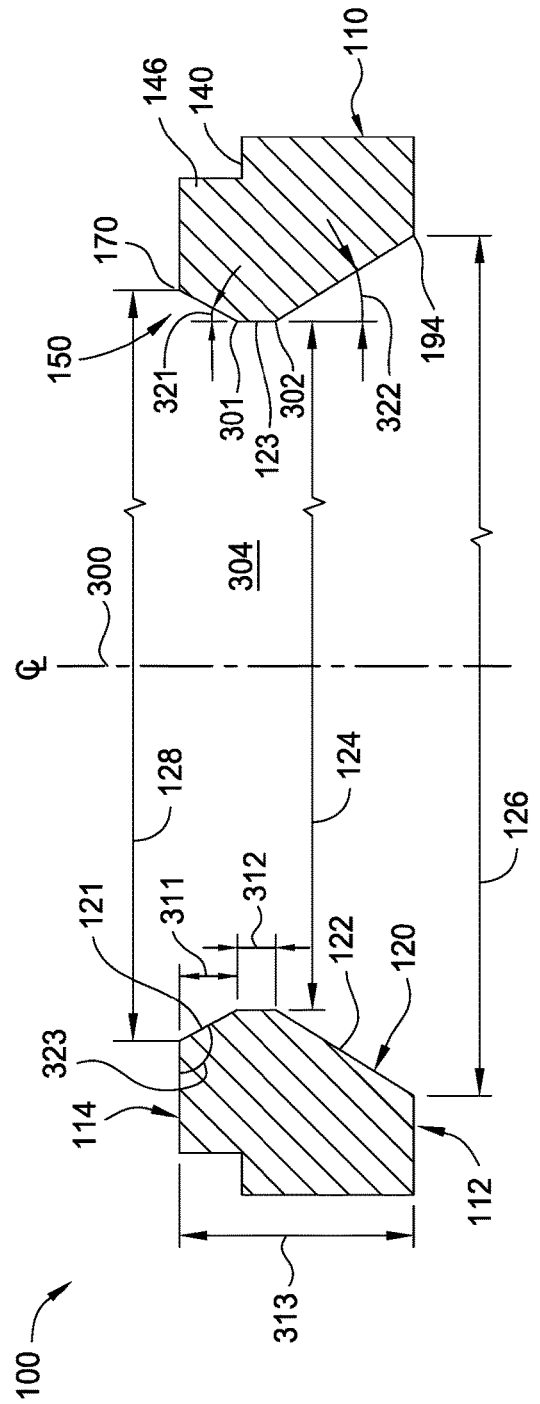
FIG. 3B illustrates a cross-sectional view of a retaining ring according to one embodiment of the disclosure.

In FIG. 3B, the cross-section of the inner surface 120 of retaining ring 100 includes three adjoining surfaces. A first surface 122, which is similar to surface 122 of FIG. 1, has a first end at the upper surface 112 at edge 194 and a second end at edge 302. The surface 122 has a cross-sectional diameter 126 at the first end and a second cross-sectional diameter 124 at the second end. The diameter 126 is larger than diameter 124 where the surface 122 has an inward taper beginning at the edge 194 towards the edge 302 defined by a slope angle 322. The slope angle 322 is measured between the surface 122 and a vertical plane parallel to the central axis 300. The slope angle 322 may be in a range, for example, from about 5 degrees to about 85 degrees, such as 20 degrees. In one embodiment, the surface 122 contacts a flexible member (not shown) as discussed relative to surface 122 of FIG. 3A. In one configuration, the surface 122 is formed in a non-faceted frustoconical shape that is symmetric about the central axis 300.

A second surface 123 adjoins the first surface 122 at edge 302. The surface 123 is a vertical planar surface parallel to the central axis 300. The surface 123 has a first end at the edge 302 and a second end at an edge at nominal inner dimension point 301. A thickness 312 of the surface 123 is measured between the edge 302 and the edge at nominal inner dimension point 301. The surface 123 has a cross-sectional diameter, such as diameter 124, which is substantially equal at the first and at the second end. In one configuration, the surface 123 is formed in a non-faceted frustoconical shape that is symmetric about the central axis 300.

A third surface 121 has a first end at the edge at nominal inner dimension point 301 abutting the second surface 123 and a second end at the lower surface 114 at the edge 170. The cross-sectional dimension of the surface 121 at the first end is substantially equal to the diameter 124 of the surface 123. A second cross-sectional dimension 128 is defined at the second end at edge 170. In FIG. 3B, the diameter 128 is greater than the diameter 124 to define a slope angle 321. The slope angle 321 is measured between the surface 121 and a vertical plane parallel to the central axis 300. Here, the surface 121 tapers outwardly from the first end to the second end at the lower surface 114. The slope angle 321 is considered negative or away from the central axis 300. In one embodiment, the surface 121 tapers inwardly from the first end to the second end where the diameter 124 is greater than the diameter 128 and the slope angle 321 is considered positive.

The slope angle 321 may be in a range, for example, from about 1 degree to about 30 degrees in either a positive direction (towards the central axis 300) or a negative direction (away from the central axis 300). In one example, the slope angle 321 is in a range from about 2 degrees to about 10 degrees in a negative direction, as shown in FIG. 3B. In such configurations, the angle 323 measured between the lower surface 114 and the surface 121 at the edge 170 is either acute or obtuse. That is, the angle 323 measured between the lower surface 114 and the surface 121 at the edge 170 does not define a right angle. For example, the angle 323 measured between the lower surface 114 and the second surface 121 at the edge 170 is between about 0.5 degrees and about 89.5 degrees or between about 90.5 degrees and about 179.5 degrees. A thickness 311 of the surface 121 is measured between the first end and the second end. The thickness 311 is generally greater than the thickness of a substrate, but may also be equal to or less than the substrate thickness.

As similarly discussed above, in some configurations, the thickness 311 measurement coincides with the magnitude of the vertical dimension (e.g., central axis 300 direction) of each of the facets 150. In this case, the lower extent of the facets 150 coincides with the edge 170 and the upper extent of the facets 150 coincides with the nominal inner dimension point 301.

In FIG. 3C, the inner surface 120 of the retaining ring 100 is a surface that includes facets 150 that extend from the edge 170 to the opposing edge 190. The surface 120 has a dimension 126 at a first end positioned at the upper surface 112 and a dimension 128 at a second end positioned at the lower surface 114. The dimension 126 is greater than the dimension 128 and thus, the facets that make up the inner surface 120 taper inwardly from the first end towards the second end to define the slope angle 321. The slope angle 321 is measured from the inner surface 120 to a vertical plane parallel to the central axis 300. The slope angle 321 may be in a range, for example, from about 1 degree to about 30 degrees, such as about 2 degrees to about 10 degrees. However, in one embodiment, the dimension 126 is less than the dimension 128 and thus, the facets taper away from the central axis 300 from the first end to the second end. In such configurations, the angle 323 measured between the lower surface 114 and the surface 121 at the edge 170 is either acute or obtuse. That is, the edge 170 does not define a right angle. For example, the angle 323 measured between the lower surface 114 and the second surface 121 at the edge 170 is between about 0.5 degrees and about 89.5 degrees or between about 90.5 degrees and about 179.5 degrees.

The surface 120 is formed so that the nominal inner dimension point 301 is positioned on the surface 120 so that it coincides with the nominal diameter 124, at the thickness 311. The diameter 124 is greater than dimension 128 and less than dimension 126. That is, the inner surface 120 has a dimension at the first end larger than the substrate diameter and a dimension at a second end less than the diameter of the substrate. The nominal inner dimension point 301 defines two portions of the inner surface 120. The first portion 121 is referred to as the substrate contact region. The second portion 122 is referred to as the flexible member contact region. In one embodiment, the portion 122 contacts a flexible member (not shown) to provide a pressure to the substrate disposed therein. Additionally, a contact between the flexible member and the inner surface 120 creates a seal to prevent passage of a polishing fluid therethrough, thus isolating a carrier head (not shown) from the polishing fluid. In one configuration, the lower extent of the facets 150 coincides with the edge 170 and the upper extent of the facets 150 will coincide with the nominal inner dimension point 301.

FIG. 3D is a fourth embodiment of the retaining ring 100. Here, the cross-section of the inner surface 120 includes two planar surfaces. A first surface 122 has a first end at upper surface 112 and a second end at an edge at nominal inner dimension point 301. The first surface 122 is substantially parallel to the central axis 300. A cross-sectional diameter 124 of the first surface 122 is equal at the first end and the second end. A second surface 121 adjoins the first surface 122 at the edge at nominal inner dimension point 301. The second surface 121 has a first end at the edge at nominal inner dimension point 301 and a second end at the lower surface 114 at edge 170. At the first end, the second surface 121 has a cross-sectional diameter equal to the diameter of the first surface 122. A cross-sectional diameter 128 at the second end is greater than the cross-sectional diameter 124 at the first end. As such, the second surface 121 tapers outwardly from the first end to the second end to define a slope angle 321.

The slope angle 321 is measured from the second surface 121 to a vertical plane parallel to the central axis 300. The slope angle 321 is considered negative or away from the central axis 300. In one embodiment, the dimension 128 is less than the diameter 124 where the first surface 122 tapers inwardly from the first end to the second end and the slope angle 321 is positive towards the central axis 300. The slope angle 321 may be in a range, for example, from about 1 degree to about 30 degrees, such as from about 2 to about 10 degrees, in either a positive (towards the central axis 300) or negative direction (away from the central axis 300). In such configurations, the angle 323 measured between the lower surface 114 and the second surface 121 at the edge 170 is either acute or obtuse. That is, the angle 323 measured between the lower surface 114 and the second surface 121 at the edge 170 does not define a right angle. For example, the angle 323 measured between the lower surface 114 and the second surface 121 at the edge 170 is between about 0.5 degrees and about 89.5 degrees or between about 90.5 degrees and about 179.5 degrees. A thickness 311 of the second surface 121 is measured between the first end and the second end. The thickness 311 is generally equal to the thickness of a substrate disposed within the retaining ring 100 but may be greater than or less than the substrate thickness.

As similarly discussed above, in some configurations, the thickness 311 measurement coincides with the magnitude of the vertical dimension (e.g., central axis 300 direction) of each of the facets 150. In this case, the lower extent of the facets 150 coincides with the edge 170 and the upper extent of the facets 150 coincides with the nominal inner dimension point 301. In one configuration, the first surface 122 illustrated in FIG. 3D is formed in a non-faceted frustoconical shape that is symmetric about the central axis 300.

In one embodiment, the retaining ring 100 is a material that is chemically inert to the CMP process. Exemplary materials include plastic materials such polyphenylene sulfide (PPS), polyetheretherketone (PEEK), or polyethermide (PEI). In other embodiments, the retaining ring is a metallic material such as aluminum or stainless steel. In another embodiment, the retaining ring 100 includes both a plastic material and a metallic material. Any material resistant to exposure of the CMP process may be utilized. In another embodiment, the retaining ring is a wear pad. In this embodiment, the wear pad is attached to the lower surface, such as by bonding or fasteners, and provides a sacrificial wear surface for contact between the polishing pad and the retaining ring 100. The pad may be replaced when it is sufficiently worn. In still further embodiments, the retaining ring includes multiple rings stacked together. It is also contemplated that any of the inner surfaces, such as surfaces 121, 122, 123 of FIG. 3B may each include an array of facets.

The embodiments herein advantageously minimize the planar non-uniformities of a substrate resulting from a polishing process. As a carrier head rotates the substrate in relation to the polishing pad, the rotational motion applies a lateral force to the substrate. Accordingly, the substrate contacts the inner surface 121 of the retaining ring 100 at one or more contact points. In conventional retaining rings, the inner surface has a cylindrical, or non-faceted, profile. Therefore, when a substrate contacts the cylindrical surface, the substrate may be biased unpredictably in an upward or downward direction at the contact points. The tapered profiles of the faceted features described herein translate the lateral force to a predictable mechanical bias of the substrate in either an upward or downward direction determined by a profile of the taper. By utilizing a tapered profile for at least a portion of the inner surface 120, the embodiments herein provide a predictable, uniform bias to the substrate surface due to the lateral force resulting in minimized non-uniformities in the planar profile.

While the foregoing is directed to embodiments of the present disclosure, other and further embodiments of the disclosure may be devised without departing from the basic scope thereof, and the scope thereof is determined by the claims that follow.

What is claimed is:

1. A retaining ring, comprising:
    an annular body comprising:
        an upper surface;
        a lower surface;
        an outer surface connected to the upper surface and the lower surface; and
        an inner surface connected to the upper surface and the lower surface, wherein the inner surface comprises:
            a first planar surface having a first angle relative to a central axis;
            a second planar surface having a second angle relative to a central axis; and
            a third planar surface disposed between the first planar surface and the second planar surface, wherein the first planar surface forms an inward taper from the first end to the second end towards a central axis and the second planar surface forms a taper outward from the first end to the second end away from the central axis.

2. The retaining ring of claim 1, wherein the second angle is between 1 degree and 30 degrees.

3. The retaining ring of claim 1, further comprising:
    one or more channels disposed within the annular body, wherein the channels have a first opening at the inner surface and a second opening at the outer surface.

4. The retaining ring of claim 1, wherein the inner surface is symmetric about a central axis.

5. The retaining ring of claim 1, wherein the second surface comprises an array of planar facets that are positioned about the central axis.

6. The retaining ring of claim 5, wherein the array of planar facets comprises 12 to 100 planar facets.

7. The retaining ring of claim 1, wherein the first angle is between 5 degrees and 85 degrees.

8. A retaining ring, comprising:
    an annular body comprising:
        an upper surface;
        a lower surface;
        an outer surface connected to the upper surface and the lower surface; and
        an inner surface connected to the upper surface and the lower surface, wherein the inner surface comprises:
            a first planar surface having a first angle relative to a central axis;
            a second planar surface having a second angle relative to a central axis; and
            a third planar surface disposed between the first planar surface and the second planar surface, wherein the first planar surface and the second planar surface each form an inward taper from the first end to the second end towards a central axis.

9. The retaining ring of claim 8, wherein the second angle is between 1 degree and 30 degrees.

10. The retaining ring of claim 8, further comprising:
    one or more channels disposed within the annular body, wherein the channels have a first opening at the inner surface and a second opening at the outer surface.

11. The retaining ring of claim 8, wherein the inner surface is symmetric about a central axis.

12. The retaining ring of claim 8, wherein the second surface comprises an array of planar facets that are positioned about the central axis.

13. The retaining ring of claim 12, wherein the array of planar facets comprises 12 to 100 planar facets.

14. The retaining ring of claim 8, wherein the first angle is between 5 degrees and 85 degrees.

15. A retaining ring, comprising:
    an annular body comprising:
        an upper surface;
        a lower surface;
        an outer surface connected to the upper surface and the lower surface; and
        an inner surface connected to the upper surface and the lower surface, wherein the inner surface comprises:
            a first planar surface having a first angle relative to a central axis;
            a second planar surface having a second angle relative to a central axis; and
            a third planar surface disposed between the first planar surface and the second planar surface, wherein the third planar surface is substantially parallel to the central axis.

16. The retaining ring of claim 15, wherein the second angle is between 1 degree and 30 degrees.

17. The retaining ring of claim 15, further comprising:
    one or more channels disposed within the annular body, wherein the channels have a first opening at the inner surface and a second opening at the outer surface.

18. The retaining ring of claim 15, wherein the inner surface is symmetric about a central axis.

19. The retaining ring of claim 15, wherein the second surface comprises an array of planar facets that are positioned about the central axis.

20. The retaining ring of claim 19, wherein the array of planar facets comprises 12 to 100 planar facets.

* * * * *